United States Patent [19]

Woolley et al.

[11] Patent Number: 4,564,941
[45] Date of Patent: Jan. 14, 1986

[54] ERROR DETECTION SYSTEM

[75] Inventors: Richard N. Woolley, Mountain View, Calif.; Neal Glover, Broomfield, Colo.; Richard Williams, San Jose, Calif.

[73] Assignee: Apple Computer, Inc., Cupertino, Calif.

[21] Appl. No.: 559,210

[22] Filed: Dec. 8, 1983

[51] Int. Cl.[4] ............................................. G06F 11/10
[52] U.S. Cl. .......................................... 371/2; 371/38
[58] Field of Search ................. 371/2, 37, 38, 49, 51, 371/53, 54

[56] References Cited

U.S. PATENT DOCUMENTS

| | | | |
|---|---|---|---|
| 3,404,373 | 10/1968 | Srinivasan | 371/2 X |
| 3,430,037 | 2/1969 | Renelt | 371/53 |
| 3,576,952 | 5/1971 | Van Duuren | 371/37 |
| 4,142,243 | 2/1979 | Bishop et al. | 371/53 X |

Primary Examiner—Charles E. Atkinson
Attorney, Agent, or Firm—Blakely Sokoloff Taylor & Zafman

[57] ABSTRACT

The present invention provides methods and apparatus for improved error detection in a data processing system. The techniques of the present invention insure that there is a high probability that an error in a record of data (each record comprising a plurality of data bits) is detected. In the event of an error, the present invention applies a randomizing function to the error which modifies subsequent bits within the record and then propagates and further randomizes the error throughout the record to magnify its apparent size. The randomizing and propagation of the error significantly lowers the misdetection probability for random errors within a record, in that error detectability is no longer pattern sensitive. The use of both propagation and randomization functions significantly alters the data containing an error, such that a high probability of detection using check-sum techniques exists.

36 Claims, 12 Drawing Figures

Fig. 1

SIMPLE CHECKSUM

INTERLEAVED CHECKSUM

Fig. 4    DATA ENCODING

A(a)

A ⟶
B ⊕ A ⟶
C ⊕ B ⟶
D ⊕ C ⟶

TO STORAGE MEANS

A(b)    DATA RECOVERY $(A \oplus \emptyset) \oplus \emptyset \Rightarrow A$
$(B \oplus A) \oplus A \Rightarrow B$
$(C \oplus B) \oplus B \Rightarrow C$
$(D \oplus C) \oplus C \Rightarrow D$

Fig. 5

DATA RECOVERY $$A \oplus e \oplus \emptyset \Rightarrow A \oplus e$$
$$B \oplus A \oplus (A \oplus e) \Rightarrow B \oplus e$$
$$C \oplus B \oplus (B \oplus e) \Rightarrow C \oplus e$$
$$D \oplus C \oplus (C \oplus e) \Rightarrow D \oplus e$$

Fig. 6(a)

ERROR PROPAGATION WITH RANDOMIZING

DATA ENCODING $$A \longrightarrow$$
$$B \oplus A' \longrightarrow$$
$$C \oplus B' \longrightarrow$$
$$D \oplus C' \longrightarrow$$

To STORAGE MEANS

Fig. 6(b)

DATA RECOVERY $$A \oplus e \oplus \emptyset \Rightarrow A \oplus e$$
$$B \oplus A' \oplus (A \oplus e)' \Rightarrow B \oplus e'$$
$$C \oplus B' \oplus (B \oplus e')' \Rightarrow C \oplus e''$$
$$D \oplus C' \oplus (C \oplus e'')' \Rightarrow D \oplus e'''$$

ENCODING

Fig. 7(c)

ROTATE $C_3$ — (RANDOMIZING FUNCTION)

$C_1 = C_1 + A + c$ $A \oplus C_3 \longrightarrow$ TO STORAGE MEANS $C_2 = C_2 + B + c$ $B \oplus C_1 \longrightarrow$ TO STORAGE MEANS $C_3 = C_3 + C + c$ $C \oplus C_2 \longrightarrow$ TO STORAGE MEANS

ROTATE $C_3$ $C_1 = C_1 + D + c$ $D \oplus C_3 \longrightarrow$ TO STORAGE MEANS $C_2 = C_2 + E + c$

⋮

DATA RECOVERY

Fig. 7(D)

$C_1, C_2, C_3, = \emptyset$ : ROTATE $C_3$ $(= \emptyset)$ $(A \oplus C_3) \oplus C_3 = A$ ; $C_1 = C_1 + A + c$ $(B \oplus C_1) \oplus C_1 = B$ ; $C_2 = C_2 + B + c$ $(C \oplus C_2) \oplus C_2 = C$ ; $C_3 = C_3 + C + c$ : ROTATE $C_3$ $(D \oplus C_3) \oplus C_2 = D$ ; $C_1 = C_1 + D + c$

⋮

ERROR DETECTION SYSTEM

BACKGROUND OF THE INVENTION

1. Field

The present invention relates to the field of error detection, and more particularly, to error detection methods utilized in a data processing system for identifying errors in stored data.

2. Art Background

The complexity of modern data processing systems requires that some means be employed in order to detect errors in stored, retrieved and otherwise manipulated data bits. For example, errors may be introduced into data as a result of mechanical and/or electrical variations in the data processing system, such as foreign material disposed on the magnetic read-write heads of a tape or disk mass media storage device. Other potential sources which may introduce errors in, or otherwise alter, data bits include the natural wearing of the storage medium, variations in the power supply voltage for the data processing system, as well as "soft" errors induced by radioactive impurities in the housing of the storage device and cosmic rays.

Figure 1:
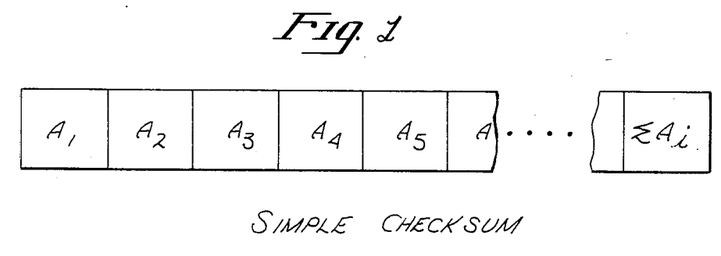
FIG. 1 is an illustration of a simple check-sum error detection system.

A variety of methods have been developed in order to detect errors introduced into stored or otherwise manipulated data. One common error detection system includes the use of a simple check-sum code. Typically, data is organized in terms of records which comprise a plurality of bytes. Each byte in turn is comprised of a plurality of bits (typically 8). A system employing the use of a simple check-sum method performs an exclusive-OR operation between each sequential byte within the record. Thus, as illustrated in FIG. 1, the 8 bits comprising byte $A_1$ are exclusive-ORed with the 8 bits comprising $A_2$. Similarly, the resultant binary quantity of the operation between $A_1$ and $A_2$ is exclusive-ORed with the bits comprising byte $A_3$, and so on. The check-sum is defined as the net resultant binary quantity obtained from these repetitive exclusive-OR operations. The resultant check-sum quantity is typically inserted at the end of the record, as illustrated in FIG. 1 as the $A_i$.

In many data processing systems, data is written onto a magnetic recording media such as a magnetic disk or tape. In those systems employing the use of a check-sum error detection method, the data in the form of numerous bytes comprising the entire record, is written sequentially onto the magnetic medium such that byte $A_1$ is written first with subsequent bytes then written, and finally one or more bytes comprising the check-sum resultant is disposed at the end of the record. When retrieving the data from the magnetic medium, the data processing system sequentially reads the content of the entire record while recalculating the value of the check-sum. After the entire record has been read from the recording medium, the recalculated check-sum value is compared with the check-sum previously recorded as part of the record. If the two check-sums do not identically match, an error in the data is assumed.

The use of a simple check-sum error detection method is not as protective as one naturally assumes. For example, the simple check-sum method has inherent pattern sensitivity for short burst errors randomly distributed throughout the record. Thus use of an exclusive-OR operation between sequential bytes within the record renders it possible for errors to cancel one another, and therefore not be detected. For example, if the bit state of bit #2 within a particular byte of the record is altered as a result of a mechanical and/or electrical malfunction (e.g. a 1 is shifted to a 0 bit state), and bit #2 of another byte is similarly altered (a 0 bit state is inadvertently shifted to a 1 bit state), the errors in the bytes will cancel during the exclusive-OR operation. In the case of two random bits in error, the probability of an error misdetection is approximately one out of eight.

Figures 2, 3:
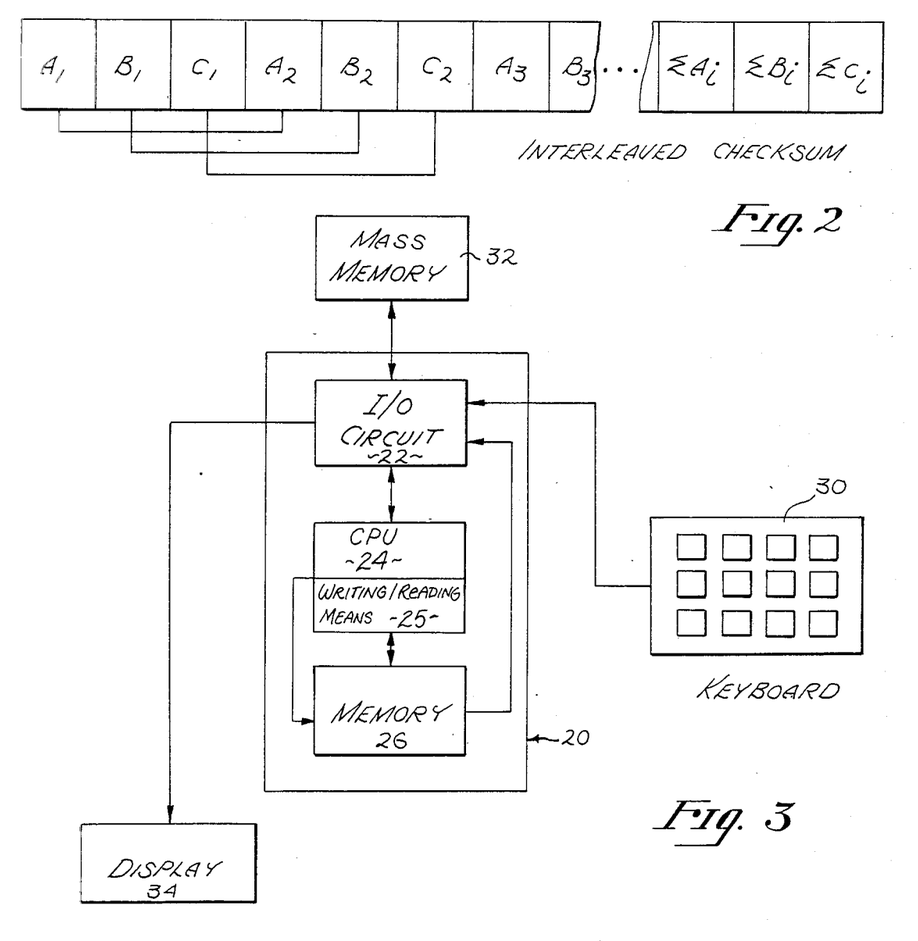
FIG. 2 is an illustration of an interleaved check-sum error detection system.
FIG. 3 is a block diagram disclosing a computer incorporating the teachings of the present invention.

One method for improving the error detection rate for the simple check-sum is to add "interleaving". For example, a 3 byte check-sum generates three separate resultant check-sum values for a record. As illustrated in FIG. 2, the first check-sum value may be determined for bytes $A_1$, $A_2$, $A_3$, etc. which represent sequential check-sum interleaved bytes. Similarly, a second check-sum would be calculated for the bytes $B_1$, $B_2$, $B_3$, etc., and a third for bytes $C_1$, $C_2$, $C_3$, etc. Although interleaving significantly lowers the misdetection probability for long random error bursts, the misdetection probability for sparse error bursts has been found to be unacceptably high.

Accordingly, there exists a need to provide a means to increase the detectability of errors in stored and manipulated data. As will be disclosed, the present invention provides apparatus and methods for improving error detectability by randomizing and propagating an error throughout the data record. The randomization and propagation of an error significantly increases the probability of its detection.

SUMMARY OF THE INVENTION

The present invention provides methods and apparatus for improved error detection in a data processing system. The techniques of the present invention insure that there is a high probability that an error in a record of data (each record comprising a plurality of data bits) is detected. In the event of an error, the present invention applies a randomizing function to the error which modifies subsequent bits within the record and then propagates and further randomizes the error throughout the record to magnify its apparent size. The randomizing and propagation of the error significantly lowers the misdetection probability for random errors within a record, in that error detectability is no longer pattern sensitive. The use of both propagation and randomization functions significantly alters the data containing an error, such that a high probability of detection using check-sum techniques exists.

NOTATION AND NOMENCLATURE

The detailed description which follows is presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be kept in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases the distinction between the method operations in operating a computer and the method of computation itself should be noted. The present invention relates to method steps for operating a computer in processing electrical or other (e.g. mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to any particular computer or other apparatus. In particular, various general purpose machines may be used with the teachings herein, or it may prove more convenient to construct more specialized apparatus to perform the required method steps. The required structure for a variety of these machines will appear from the description given below.

DETAILED DESCRIPTION

The following detailed description will be divided into several sections. The first of these will treat a general system arrangement for storing, retrieving and manipulating data. Subsequent sections deal with apparatus and methods for obtaining improved error detection capability in a data processing system.

In addition, in the following description, numerous details are set forth such as algorithmic conventions, specific numbers of bits, binary operations, etc., in order to provide a thorough understanding of the present invention. However, it will be apparent to one skilled in the art that the present invention may be practiced without these specific details. In other Instances, well-known circuits and structures are not described in detail in order not to obscure the present invention unnecessarily.

GENERAL SYSTEM CONFIGURATION

FIG. 3 illustrates a typical computer-based system for reading, storing and manipulating data. Shown there is a computer 20 which comprises three major components. The first of these is the input/output (I/O) circuit 22 which is used to communicate information in appropriately structured form to and from the other parts of computer 20. Also shown as a part of computer 20 is the central processing unit (CPU) 24 and memory 26. As illustrated, CPU 24 also includes a writing/reading means 25 for writing data and reading data out of memory 26. These latter two elements are those typically found in most computers. In fact, the several elements contained within computer 20 are intended to be representative of this broad category of data processors. Particular examples of suitable data processors to fill the role of computer 20 included machines manufactured by Apple Computer, Inc., in Cupertino, Calif. Other computers having like capabilities may, of course, be adapted in a straightforward manner to perform the several functions described below.

Also shown in FIG. 3 is an input device 30, shown in typical embodiment as a keyboard. It should be understood, however, that the input device may actually be a card reader, magnetic or paper tape reader, or other well-known input device (including, of course, another computer). A mass memory device 32 coupled to the I/O circuit 22 provides additional storage capability for the computer 20. The mass memory may include other programs and the like and may take the form of a magnetic or paper tape reader or other well known device. It will be appreciated that the data retained within mass memory 32, in appropriate cases, may be incorporated in standard fashion into computer 20 as part of memory 26.

In addition, a display monitor 34 is illustrated which is used to display the data being manipulated by the present invention. Such a display monitor may take the form of any of several well-known varieties CRT displays.

In the course of operation of computer 20, errors may be introduced into data which is stored and retrieved from memory 26 and mass memory 32. The failure to detect errors in stored or otherwise manipulated data may generate spurious computer responses. As will be disclosed, the present invention provides methods and apparatus for increasing the detectability of errors in stored or otherwise manipulated data, thereby significantly improving the reliability of computer operations.

PROPAGATION OF ERRORS

As previously discussed, the use of interleaving significantly decreases the misdetection probability in the case of long random error bursts within a record. However, it has been found that the likelihood of error misdetection for sparse error bursts randomly distributed throughout the record remains unacceptably high. Therefore, one aspect of the present invention operates to propagate an error throughout the record, thereby increasing the likelihood of detection.

Figure 4:
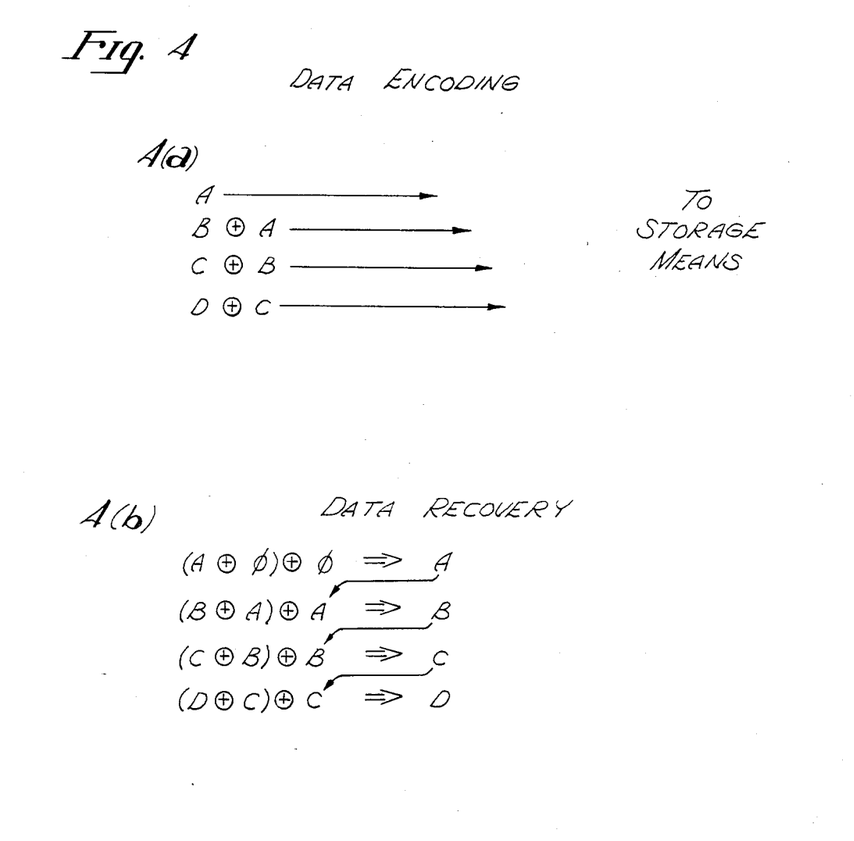
FIGS. 4(a)-(b) illustrate one storage and retrieval method utilized by the present invention.

Referring now to FIG. 4, the present invention's method for the propagation of errors is disclosed. Individual bytes of data, A, B, C and D, which may comprise sequential interleaved bytes in a record, are to be stored or otherwise manipulated in a computer system. The present invention directly stores the first byte A in, for example, memory 26 or mass memory 32, which may comprise a magnetic storage medium or the like. As illustrated, the contents of the next byte, B, is exclusive-ORed with the contents of previous byte A, and the binary quantity resulting from this exclusive-OR operation between bytes B and A are stored. Similarly, the contents of previous byte B, and that resultant binary quantity is also stored. Thus, unlike prior art encoding methods for storing data in a storage device, the present invention stores the *result* of a series of exclusive-OR operations between sequential (or interleaved) bytes of a record.

Referring now to FIG. 4(b), the recovery of data stored in accordance with a scheme of FIG. 4(a) is described. As illustrated, data is decoded from the resultant binary quantities stored in accordance with the method described in conjunction with FIG. 4(a), by the use of additional exclusive-OR operations. As shown, the retrieved resultant binary quantities are exclusive-ORed with the decoded results obtained from the immediately preceding (or interleaved) byte. For example, the retrieval from mass memory 32 or memory 26, of byte A results simply in binary quantities representative of the contents of byte A inasmuch as byte A was retrieved without alteration within the storage means. However, the retrieval of the subsequently stored resultant quantity (B⊕A) from storage means 32 or the like is exclusive ORed with the previously decoded byte, namely A in the present example. It will be apparent, that the exclusive-OR operation between the stored resultant quantities of FIG. 4(a), and the previously recovered data (for example, byte A) effectively decodes and recovers byte B. Similarly, an exclusive-OR operation between the recovered byte B and encoded quantity (C⊕B) results in the recovery of byte C. Thus, the method illustrated in FIG. 4 provides a means whereby data may be encoded and stored in a storage device and later decoded utilizing a series of simple exclusive-OR operations.

Figure 5:
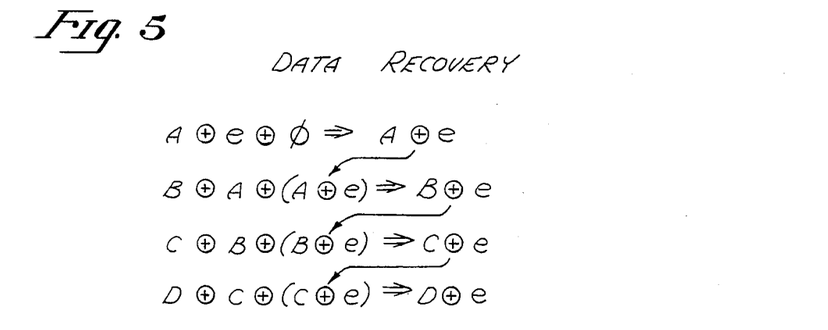
FIG. 5 illustrates the propagation of an error using the technique of FIGS. 4(a)-(b).

Referring now to FIG. 5, the propagation of a random error in a data record is illustrated. In accordance with the teachings of the present invention, the first record byte A is stored within the desired storage means such as mass memory 32 or memory 26 of computer 20. Subsequent (whether consecutive or interleaved) byte B is exclusive-ORed with the contents of byte A with the resultant quantity stored in the desired storage means. Similarly, subsequent bytes C, D, etc., are exclusive-ORed with previous data bytes in accordance with the method of FIG. 4(a).

Assume for sake of example, that an inadvertent error, "e", is present within byte A of a record. This error may be introduced during the readback or original write cycle or as a result of any one of many possible previously described causes. Thus, the retrieval of the first byte of a record results in a quantity representative of byte A⊕e. Utilizing the teachings of the present invention this quantity (A⊕e) is exclusive-ORed with the subsequently stored resultant quantity (B⊕A). The net result from this exclusive-OR operation is the quantity (B⊕e). Thus, error e has been propagated into subsequent byte B, and as is apparent from FIG. 5, error e is similarly propagated throughout each byte of the record. In operation, a data processing system incorporating a simple check sum procedure would compare the recalculated check sum value based on the retrieved data illustrated in FIG. 5 with the previously stored check sum quantity for the data originally stored pursuant to the procedures of FIG. 4(a). Due to the propagation of the error in accordance with the method of the present invention, the check sums would not match and an error would be assumed.

PROPOGATION AND RANDOMIZATION

Figure 6A:
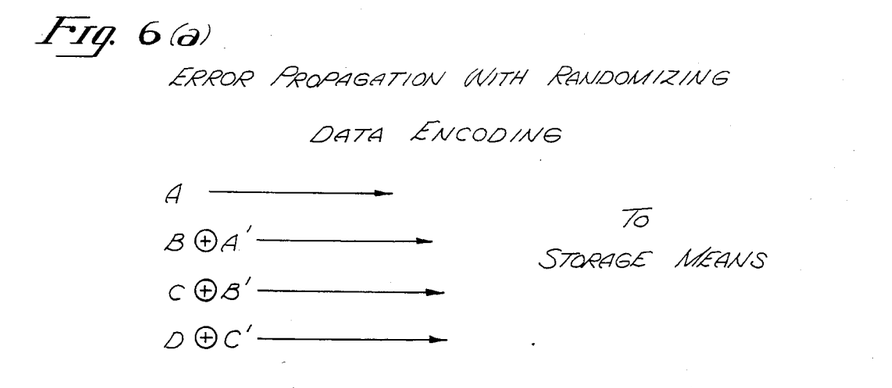
FIGS. 6(a)-(b) illustrate a storage and retrieval method for propagation and randomization of an error utilized by the present invention.

Referring now to FIG. 6, a method utilizing the teachings of the present invention will be described which both propagates and randomizes errors within a data record. As previously used, A, B, C and D represent consecutive bytes (whether sequential or interleaved) within a record. The notation prime "'" represents a function, where the function is designed to be as random as possible. A double prime "''" represents the function applied twice, and so on. As previously disclosed, the present invention directly stores the first byte A in the particular memory means used. As illustrated, the contents of the next sequential byte B, is exclusive OR-ed with the contents of the previous byte A to which a randomizing function has been applied. The binary quantity resulting from this exclusive-OR operation between bytes B and A' are then stored in the storage means. Similarly, the contents of sequential byte C are exclusive-ORed with the contents of previous byte B to which the function has been applied, and the resultant binary quantitites are then also stored. It will be appreciated, that the particular randomizing function may comprise a variety of well known randomization algorithms, however, in the present invention a linear randomizing function is utilized.

Figure 6B:
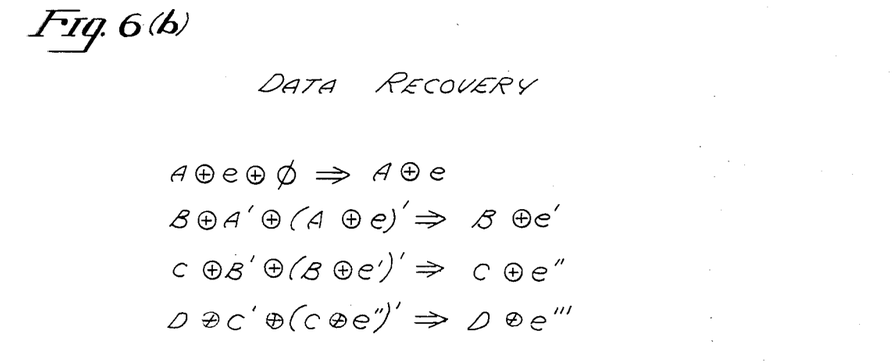

Referring now to FIG. 6(b), the effect of an error randomly located in a data record is illustrated. Assume for sake of example, that an inadvertent error "e" is present within byte A of a record. As shown in FIG. 6(b), the retrieval of the first byte of a record results in a quantity representative of byte A⊕e. Utilizing the teachings of the present invention, the randomizing function is applied to the quantity A⊕e resulting in the quantity (A⊕e)'. This quantity (A⊕e)' is then exclusive-ORed with the subsequently stored resultant quantity B⊕A'. The net result from this exclusive-OR operation is the quantity B⊕e'; where e' equals A'⊕(A⊕e)'. Thus, error e has been propogated into subsequent byte B, and has been randomized in accordance with a chosen randomizing function. Similarly, the randomizing function is applied to the resultant B⊕e' thereby obtaining (B⊕e')' which is in turn exclusive-ORed with the previously stored quantity C⊕B', thereby resulting in the retrieved binary quantity C⊕e''; where e'' equals B'⊕(B⊕e')'. Thus, the randomizing function has been applied to error e twice thereby randomizing the previously randomized error as it is propagated through the record. This procedure is repeated as data is sequentially read from the record, thereby randomizing and propogating the error throughout the entire record and significantly increasing the probability of detection utilizing check-sum techniques.

Figure 7A:
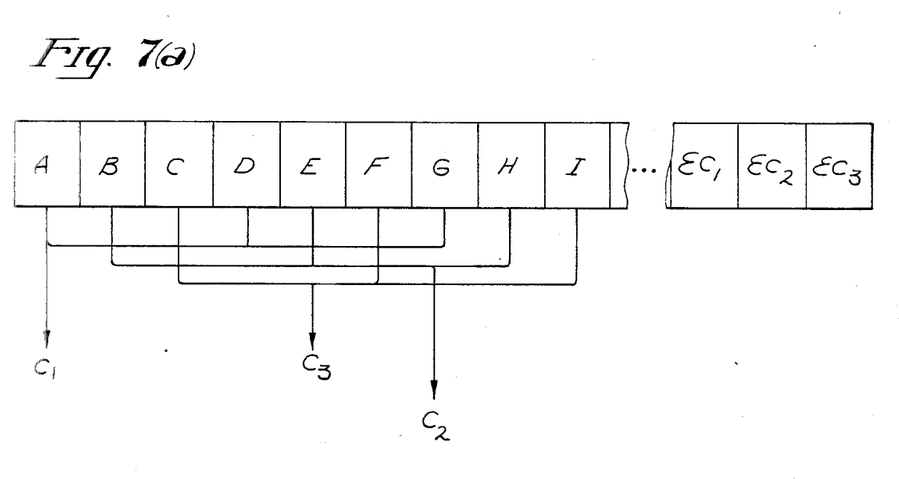
FIGS. 7(a)-(d) illustrate another storage and retrieval method of the present invention for randomizing and propagating an error using interleaved check-sums.

Referring now to FIGS. 7(a)-7(d), another embodiment of the present invention is disclosed. Although the present invention has been discussed utilizing randomizing and propogating methods as applied to sequential or interleaved bytes in a data record, it has been found that high detection probability is achieved by applying the teachings of the present invention *directly* to the *check-sum* quantities themselves. As shown in FIG. 7(a), a data record includes bytes A, B, C, D, etc. Check-sum quantities C1, C2 and C3 are located at the end of the data record. As illustrated, the preferred embodiment of the present invention utilizes a 3 byte interleaved check-sum system, wherein bytes A, D, G, etc., comprise sequential interleaved bytes of check-sum C1. Similarly, sequential interleave bytes B, E, H, etc., comprise bytes of check-sum C2. Finally, bytes C, F, I, etc., comprise sequential interleaved bytes of check-sum C3. In addition, it will be noted that "c" indicates a carry from a previous operation.

Figure 7B:
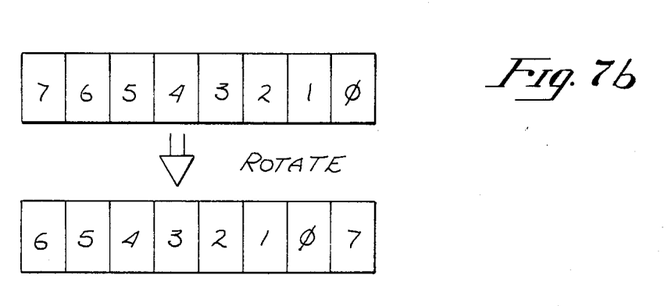

As illustrated in FIG. 7(b), the randomizing function of the embodiment in FIG. 7 comprises a "rotate" wherein the contents of check-sum C3 are shifted one bit to the left (namely least significant bit toward most significant bit) and the most significant bit is rotated to the least significant bit position. It has been found that the use of a rotate for randomization permits real time implementation in a variety of computer systems.

Figure 7C:
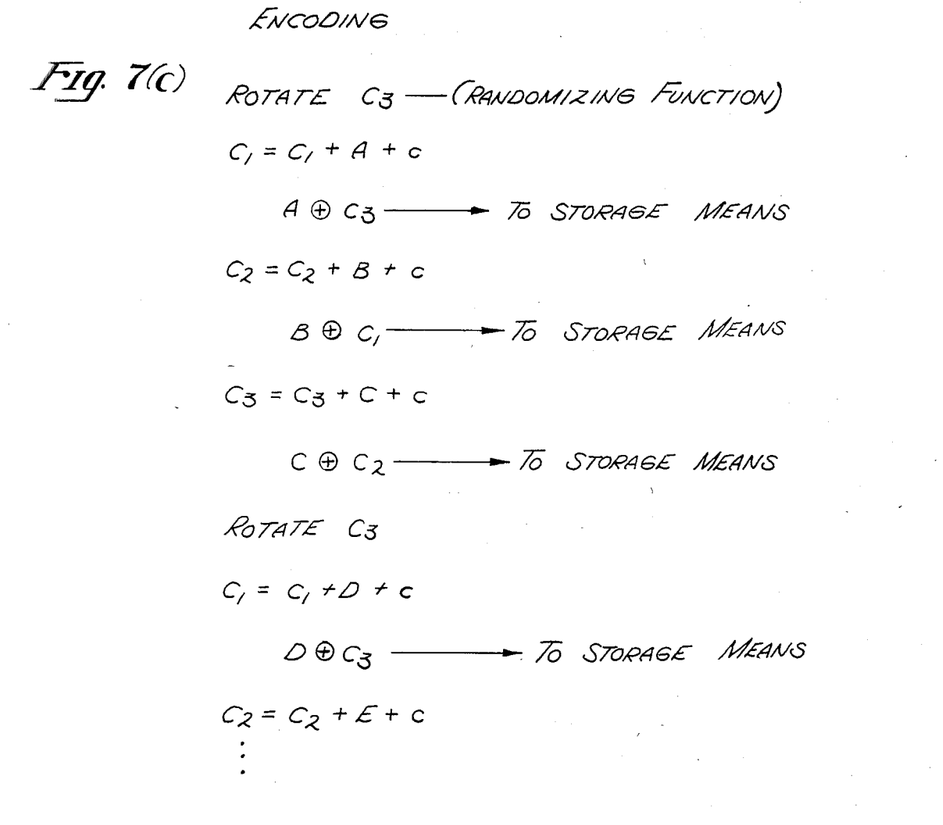

As shown in FIG. 7(c), data encoding in accordance with the teachings of the present invention includes an initial rotation of check-sum C3 (which at the beginning of the procedure will simply result in the rotation of binary zeros inasmuch as no data has previously been stored). Check-sum C1 is then set equal to check-sum C1 plus the contents of byte A (plus any carry c). At initialization, C1 will simply equal the contents of byte A. As shown, the first byte is set equal to binary quantity A exclusive-ORed with the contents with check-sum C3, and this binary quantity is then stored in an appropriate storage means. For the first byte of a record, the contents of byte A will simply be stored in mass memory 32 or memory 26 of computer 20 since C3 is set initially to zero. Check-sum quantity C2 is set equal to the previous content of C2 plus the binary quantity comprising byte B as well as any carry which exists. Byte B of the record is then exclusive-ORed with the contents of check-sum C1 and this resultant quantity is stored in the appropriate storage means. Check-sum C3 is then set equal to its previous contents plus the contents of byte C plus carry. The contents of byte C is exclusive-ORed with the contents of check-sum C2 and this quantity is then stored. Once the first three bytes, A⊕C3, B⊕C1 and C⊕C2, are stored in the storage means in accordance with the previous discussion, the contents of check-sum C3 are then once again rotated by a one bit shift as shown in FIG. 7(a).

The contents of check-sum C1 are then added to the contents of byte D of the record plus any resultant carry. The contents of byte D are exclusive-ORed with the contents of check-sum C3 and this resultant quantity is then stored in the storage means. As shown, the contents of check-sum C2 are then added to the contents of byte E of the record plus any carry in order to redefine the contents of check-sum C2. Similarly, subsequent bytes comprising the record illustrated in FIG. 7(a) are stored in the appropriate storage means, and check-sums, C1, C2 and C3 are accordingly updated.

Figure 7D:
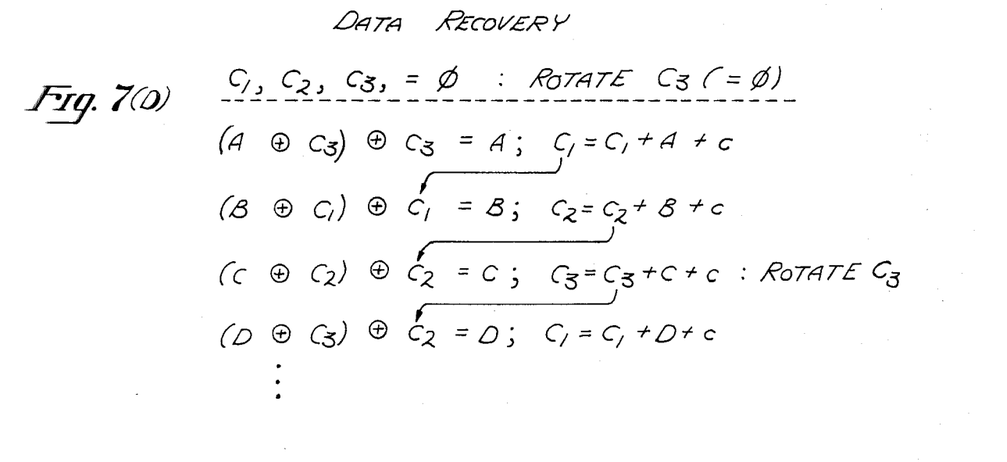

Referring now to FIG. 7(d), data recovery in accordance with the encoding scheme disclosed in FIGS. 7(a)-7(c) will be discussed. Prior to retrieval, check-sums C1, C2 and C3 are defined within computer memory 26 of computer 20, and are set equal to zero. It will be recalled, that the resultant end of record check-sum quantitites C1, C2 and C3 are stored at the end of the record illustrated in FIG. 7(a). As shown, the retrieved quantity A⊕C3 is exclusive-ORed with the contents of check-sum C3 (which equals 0) thereby resulting in a true retrieval of the contents of byte A if A⊕C3 contains no errors. Once byte A is retrieved, as shown, C1 is updated by adding contents of C1 with byte A plus any carry (none in the present example). Similarly, the previous binary quantity B⊕C1 is exclusive-ORed with the newly updated value of C1, resulting in the decoding and retrieval of byte B. C2 is then updated by adding the contents of byte B (plus any carry). Byte C is retrieved by exclusive-ORing the previously stored quantity C⊕C2 with the newly updated value of C2. C3 is then updated by adding the value of byte C, and then performing a rotate as previously described. In this fashion, sequential bytes comprising the record are decoded and retrieved.

CODING DETAILS

No particular programming language has been indicated for carrying out the various procedures described above. This is in part due to the fact that not all languages that might be mentioned are universally available. Each user of a particular computer will be aware of the language which is most suitable for his immediate purposes. In practice, it has proven useful to substantially implement the present invention in an assembly language which provides a machine executable object code.

Because the computers and the monitor systems which may be used in practicing the instant invention consist of many diverse elements, no detailed program listing have been provided. It is considered that the operations and other procedures described above and illustrated in the accompanying drawings are sufficiently disclosed to permit one of ordinary skill to practice the instant invention or so much of it as is of use to him.

Thus, methods and apparatus which are most advantageously used in conjunction with a digital computer to provide improved error detection have been disclosed. The present invention's randomization and propagation of errors throughout a data record significantly reduces the error misdetection probability and thereby increases the reliability of a data processing system.

We claim:

1. A method for storing and recovering data in a data processing system, said data being organized into a plurality (N) of sequential bytes, such that an error in a byte is propagated throughout each subsequent byte, comprising the steps of:

performing an exclusive-OR operation between each byte (i) and the previous byte (i−1) in order to obtain a resultant value ($R_i$);

storing each of said resultant values $R_i$ in a storage device;

reading said resultant values $R_i$ from said storage device;

recovering said data bytes from said resultant values by performing an exclusive-OR operation between each value $R_i$ and the previously recovered data byte (i−1), such that:

$$\text{byte} = [R_i \oplus \text{byte}_{i-1}]_{i=1}^{i=N}$$

where:

"N" = number of bytes in said data, and

"⊕" denotes an exclusive-OR operation;

whereby an error in a byte is propagated throughout subsequent bytes, thereby increasing the detectability of said error.

2. The method as defined by claim 1, further including the step of calculating a first check-sum quantity for said data prior to said storage step and storing said first check-sum with said resultant values $R_i$ in said storage means.

3. The method as defined by claim 2, further including the step of calculating a second check-sum quantity for said recovered data.

4. The method as defined by claim 3, wherein an error is detected if said first and second check-sum quantities do not match.

5. The method as defined by claim 4, wherein said first and second check-sums are calculated by evaluating the expression:

$$\text{check-sum} = \left[ \sum_{\substack{i=0 \\ \text{Mod}_2}}^{N-1} \text{byte}_i \right]$$

where, $\text{byte}_i$ denotes a byte at position i (where i=0, 1, 2 ... N−1) in said data.

6. The method as defined by claim 5, wherein a plurality of first and second check-sums are calculated for said data, each of said check-sums being calculated for a predetermined interleaved multiple of an initial specified byte.

7. An improved error detection system for data stored and recovered in a data processing system comprising:
  storage means for storing data as a plurality (N) of sequential bytes;
  processing means coupled to said memory means for performing logical operation on said data, said processing means including:
  writing means for performing an exclusive-OR operation between each byte (i) and the previous byte (i−1) of said data in order to obtain a resultant value ($R_i$), and storing said resultant value $R_i$ in said storage means;
  reading means for recovering said data bytes from said resultant values by performing an exclusive-OR operation between each value $R_i$ and the previously recovered data byte (i−1), such that:

$$\text{byte} = [R_i \oplus \text{byte}_{i-1}]_{i=1}^{i=N}$$

where:
  "N"=number of bytes in said data, and
  "$\oplus$" denotes an exclusive-OR operation;
  whereby an error in a byte is propagated throughout subsequent bytes, thereby increasing the detectability of said error.

8. The error detection system as defined by claim 7, wherein said processing means includes means for calculating a first check-sum quantity for said data and storing said first check-sum in said storage means with said resultant values $R_i$.

9. The error detection system as defined by claim 8, wherein said processing means includes means for calculating a second check-sum quantity for said recovered data.

10. The error detection system as defined by claim 9, wherein an error is detected if said first and second check-sums do not match.

11. The error detection system as defined by claim 10, wherein said first and second check-sums are calculated by said processing means by evaluating the expression:

$$\text{Checksum} = \left[ \sum_{\substack{i=0 \\ \text{Mod}_2}}^{N-1} \text{byte}_i \right]$$

where, $\text{byte}_i$ denotes a byte at position i (where i=0, 1, 2 ... N−1) in said data.

12. The error detection system as defined by claim 11, wherein a plurality of first and second check-sums are calculated for said data, each of said check-sums are calculated for a predetermined interleaved multiple of an initial specified byte.

13. A method for storing and recovering data in a data processing system, said data being organized into a plurality (N) of sequential bytes, such that an error in a byte is distributed and propagated throughout each subsequent byte, comprising the steps of:
  performing an exclusive-OR operation between each byte (i) and the previous byte (i−1), said previous byte having been randomized by a predetermined function in order to obtain a resultant value ($R_i$);
  storing the value of each of said resultant values $R_i$ in a storage device;
  reading said resultant values $R_i$ from said storage device;
  recovering said data bytes from said resultant values by performing an exclusive-OR operation between each value $R_i$ and the previously recovered data byte, said predetermined function having been applied to said previously recovered data byte (i−1) prior to said exclusive-OR operation such that:

$$\text{byte}_i = [R_i \oplus (\text{byte}_{i-1})']_{i=1}^{i=N}$$

where:
  "N"=number of sequential bytes in said data
  "$\oplus$" denotes an exclusive-OR operation
  "'" represents said predetermined function;
  whereby an error in a byte is distributed and propagated throughout each subsequent byte, thereby increasing the detectability of said error.

14. The method as defined by claim 13, further including the step of calculating a first check-sum quantity for said data prior to said storage step and storing said first check-sum with said resultant values $R_i$ in said storage means.

15. The method as defined by claim 14, further including the step of calculating a second check-sum quantity for said recovered data.

16. The method as defined by claim 15, wherein an error is detected if said first and second check-sum quantities do not match.

17. The method as defined by claim 16, wherein said first and second check-sums are calculated by evaluating the expression:

$$\text{checksum} = \left[ \sum_{i=0}^{N-1} \text{byte}_i \atop \text{Mod}_2 \right]$$

where, $\text{byte}_i$ denotes a byte at position i (where i=0, 1, 2 ... N−1) in said data.

18. The method as defined by claim 17, wherein a plurality of first and second check-sums are calculated for said data, each of said check-sums being calculated for a predetermined interleaved multiple of an initial specified byte.

19. The method as defined by claim 18, wherein said bytes are interleaved by 1.

20. The method as defined by claim 18, wherein said bytes are interleaved by 3.

21. The method as defined by claim 18, wherein said data is organized into records, each of said records comprising a plurality of bytes having 8 bits.

22. An improved error detection system for data stored and recovered in a data processing system, comprising:
   storage means for storing data as a plurality (N) of sequential bytes;
   processing means coupled to said memory means for performing logical operations on said data, said processing means including:
   writing means for performing an exclusive-OR operation between each byte (i) and the previous byte (i−1), said previous byte having been randomized by a predetermined function in order to obtain a resultant value ($R_i$) and storing said resultant value $R_i$ in said storage means;
   reading means for recovering said data bytes from said resultant values by performing an exclusive-OR operation between each value $R_i$ and the previously recovered data byte, said predetermined function having been applied to said previously recovered data byte (i−1) prior to said exclusive-OR operation such that:

$$\text{byte}_i = [R_i \oplus (\text{byte}_{i-1})']_{i=1}^{i=N}$$

where:
   "N"=number of sequential bytes in said data
   "$\oplus$" denotes an exclusive-OR operation
   "'" represents said predetermined function;
   whereby an error in a byte is distributed and propagated throughout each subsequent byte, thereby increasing the detectability of said error.

23. The error detection system as defined by claim 22, wherein said processing means includes means for calculating a first check-sum quantity for said data and storing said first check-sum in said storage means with said resultant values $R_i$.

24. The error detection system as defined by claim 23, wherein said processing means includes means for calculating a second check-sum quantity for said recovered data.

25. The error detection system as defined by claim 24, wherein said processing means includes means for calculating a plurality of said first and second check-sums for said data, each of said check-sums calculated for a predetermined interleaved multiple of an initial specified byte.

26. The error detection system as defined by claim 25, wherein said bytes are interleaved by one.

27. The error detection system as defined by claim 25, wherein said bytes are interleaved by three.

28. A method for storing data in a data processing system, said data being organized into a plurality (N) of sequential interleaved bytes, comprising the steps of:
   defining first and second check-sums corresponding to interleaved bytes of said data;
   randomizing the contents of said second check-sum by a predetermined function;
   setting the contents of said first check-sum equal to the contents of said first check-sum plus the contents of said first byte;
   performing an exclusive-OR operation between the randomized contents of said second check-sum and said first byte;
   storing the resultant value of said exclusive-OR operation in a storage device.

29. The method as defined by claim 28, further including the steps of:
   setting the contents of said second check-sum equal to the sum of the contents of said second check-sum plus the contents of said second byte;
   performing an exclusive-OR operation between the contents of said first check-sum and the contents of said second byte;
   storing the resultant value of said exclusive-OR operation in said storage device.

30. The method as defined by claim 29, further including the step of defining a third check-sum corresponding to bytes of said data interleaved by three.

31. The method as defined by claim 30, wherein said randomization function comprises a linear rotation of the contents of said second check-sum.

32. The method as defined by claim 31, wherein said method is applied to each of said sequential interleaved bytes, such that representations of each of said bytes are stored.

33. The method as defined by claim 28, further including a method for recovering said stored data, comprising steps of:
   setting the value of said first and second check-sums equal to zero;
   reading the first said stored resultant value obtained from said excusive-OR operation between said second check-sum and said first byte from said storage device;
   performing an exclusive-OR operation between said resultant value and said second check-sum, such that said first data byte is recovered;
   setting the contents of said first check-sum equal to the value of said first check-sum plus said first byte.

34. The method of recovery as defined by claim 33, further comprising the steps of:
   reading the second said stored resultant value obtained from said exclusive-OR operation between said first check-sum and the contents of said second byte;
   performing an exclusive-OR operation between said resultant value and said first check-sum, such that said second data byte is recovered;
   setting the contents of said second check-sum equal to the value of said second check-sum plus said second byte;
   randomizing the contents of said second check-sum by said predetermined function.

35. The method as defined by claim 34, further including the step of defining a third check-sum corresponding to bytes of said data interleaved by three.

36. The method as defined by claim 35, wherein said method is applied to each of said plurality (N) bytes to recover said data from said storage device.

* * * * *